US006650605B1

(12) United States Patent
Lehr

(10) Patent No.: US 6,650,605 B1
(45) Date of Patent: Nov. 18, 2003

(54) APPARATUS FOR SCANNING OPTICAL RECORDING MEDIA

(75) Inventor: Steffen Lehr, Villingen-Schwenningen (DE)

(73) Assignee: Thomson Licensing, S.A., Boulogne-Billancourt (FR)

( * ) Notice: Subject to any disclaimer, the term of this patent is extended or adjusted under 35 U.S.C. 154(b) by 608 days.

(21) Appl. No.: 09/599,683

(22) Filed: Jun. 22, 2000

(30) Foreign Application Priority Data

Jul. 5, 1999 (DE) .......................... 199 30 513

(51) Int. Cl.[7] ............................... G11B 7/00
(52) U.S. Cl. .................. 369/44.25; 369/44.34
(58) Field of Search ............... 608/44.11, 44.27, 608/44.29, 44.25, 44.34, 44.37, 124.1, 124.12, 44.35, 44.36, 44.42

(56) References Cited

U.S. PATENT DOCUMENTS

| 4,942,563 A | * | 7/1990 | Yamamuro ............ 369/44.34 |
| 5,168,488 A | * | 12/1992 | Isaka .................... 369/53.32 |
| 5,254,957 A | | 10/1993 | Lauffenburger ........... 330/308 |
| 5,574,702 A | | 11/1996 | Ishii ........................ 369/13 |
| 5,699,343 A | | 12/1997 | Moritsugu et al. ......... 369/124 |
| 6,314,069 B1 | * | 11/2001 | Ceshkovsky ........... 369/44.35 |
| 6,347,067 B1 | * | 2/2002 | Lee ...................... 369/44.28 |

* cited by examiner

Primary Examiner—Thang V. Tran
Assistant Examiner—Bach Vuong
(74) Attorney, Agent, or Firm—Joseph S. Tripoli; Joseph J. Laks; Reitseng Lin

(57) ABSTRACT

An apparatus for scanning optical recording media, having a detection unit with a photodetector and a reference voltage associated therewith, an evaluation unit having an input, and a connection disposed between the detection unit and the input of the evaluation unit. In such scanning apparatuses, voltage coupling is usually provided between the detection unit and the input of the evaluation unit. Such a coupling arrangement has the disadvantage that the two units must operate in approximately the same voltage range. In the scanning apparatus according to the present invention it is not necessary for the detection unit and the evaluation unit to operate in substantially the same voltage range. According to the present invention, the evaluation unit has a controller, that holds the input of the connection at the value of a reference voltage of the detection unit.

15 Claims, 3 Drawing Sheets

APPARATUS FOR SCANNING OPTICAL RECORDING MEDIA

FIELD OF THE INVENTION

The present invention relates to an apparatus for scanning optical recording media, having a detection unit, an evaluation unit and a connection between these units.

BACKGROUND OF THE INVENTION

In apparatuses of this type, voltage coupling is usually provided between detection unit and evaluation unit. This has the disadvantage that the two units have to operate approximately in the same voltage range.

SUMMARY OF THE INVENTION

An object of the present invention is to propose an apparatus of the generic type in which it is not necessary for detection unit and evaluation unit to operate in the same voltage range.

This object is achieved according to the invention by virtue of the fact that the evaluation unit has a controller, which holds the input of the connection at the value of a reference voltage of the detection unit or a value which is proportional thereto. This has the advantage that current coupling is made possible, even though the detection unit has a voltage output, and an accurate transmission of the signal is nevertheless made possible, since both the detection unit and the evaluation unit operate with the same voltage reference with a voltage reference derived from a single reference voltage. According to the invention, the voltage references utilized by detection unit and evaluation unit can be chosen either such that they are identical or alternatively such that they have different magnitudes.

According to the invention, the connection has a defined resistor and the control loop of the evaluation unit uses a reference voltage of the detection unit as desired value and the signal present on the connection as actual value. This has the advantage that the control loop regulates the voltage present on the connection to a constant value, with the result that the input current can be evaluated by the evaluation unit. In this case, the defined resistor is chosen in such a way as to obtain optimum matching between detection unit and evaluation unit. It is to be noted that the desired value is sometimes also referred to as the set point of a servo control loop.

In accordance with an advantageous refinement, the evaluation unit has a differential input. This reduces the influence of interference on the supply voltage or other equivalent or common-mode interference, since, in this case, the reference value is also present as a current and, consequently, two current values are compared with one another. Instances of common-mode interference that possibly occur affect both currents and therefore cancel one another out to the greatest possible extent during evaluation. The accuracy of the signal to be evaluated is thus increased.

A particularly simple realisation of a differential input consists in the evaluation unit having a further control loop, whose desired value corresponds to the reference voltage and whose actual value is connected to the reference voltage via a defined resistor corresponding to that of the connection.

The evaluation unit advantageously has an adjustable current amplifier. Depending on the type of further processing, the corresponding output current of the current amplifier is then fed to an analogue current or current-voltage conversion output stage and/or to an analogue-digital converter. Consequently, in an advantageous manner, even if the input current is small, a large output signal is nevertheless available.

The gain factor of the current amplifier is variable according to the invention. This has the advantage that it can be matched to the respective conditions of the detector unit, of the optical arrangement, of the connection and, if appropriate, of other parts of the apparatus. In an advantageous manner, the gain factor is also variable during operation, in order to be matched for example to changes which are due to ageing, dictated by temperature, dependent on properties of the recording medium or else caused in some other way.

According to the invention, the defined resistor can also be chosen within wide limits. A configuration of the defined resistor as a variable resistor also lies within the scope of the invention. This has the advantage that, in combination with the variable current gain of the evaluation unit, it is possible to use a broad spectrum of different detector units with different sensitivities and recording media having different reflectivity, without adaptations to the hardware being necessary. A further advantage of this configuration is that addition of different signals from the detection unit can be obtained simply by connecting a single input of the evaluation unit to a plurality of outputs of the detection unit via a respective defined resistor.

One variant of the invention provides for the evaluation unit to be connected to a reference voltage source via a voltage divider. This has the advantage that the reference voltage present at the evaluation unit can be reduced even more extensively, without requiring changes, in particular a reduction in the reference voltage of the detection unit. Consequently, the evaluation unit can be operated with an even lower supply voltage and hence more economically.

A further variant of the invention provides for the evaluation unit itself to have a reference voltage source. This has the advantage that the reference voltage source can be implemented in a simple and cost-effective manner in the integrated circuit of the evaluation unit. The reference voltage generated in this case is not only utilised internally but also, advantageously having been boosted by means of an external voltage boosting circuit, is used as a reference voltage for the detection unit.

It goes without saying that the invention is not restricted to the variants and exemplary embodiments specified, but also includes the developments which are-within the abilities of a person skilled in the art. Two advantageous configurations of the present invention are described below with reference to the Figures.

DETAILED DESCRIPTION OF THE DRAWINGS

Figure 1:
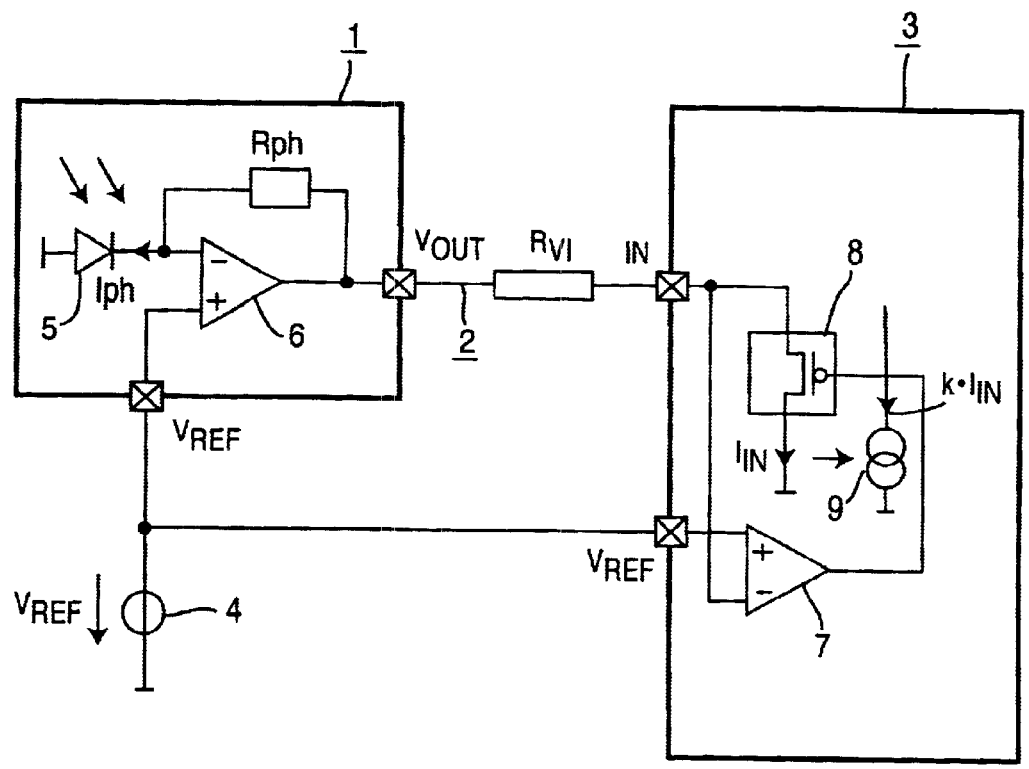
FIG. 1 shows a schematic illustration of part of a first embodiment of an apparatus according to the invention.

FIG. 1 schematically illustrates part of a first embodiment of an apparatus according to the invention. A detection unit 1 is connected to an evaluation unit 3 by means of a connection 2. A reference voltage source 4 generates a reference voltage $V_{REF}$, which is present at a reference voltage input of the detection unit 1 and of the evaluation unit 3. A photodiode 5 is depicted as photodetector in the detection unit 1, which photodiode outputs a photocurrent $I_{PH}$ as a function of the light intensity that is incident on it. The photocurrent $I_{PH}$ is passed via a current-voltage converter, formed in this case from operational amplifier 6 and resistor $R_{PH}$, as output voltage $V_{OUT}$ to an output of the detection unit. In this case, the reference voltage $V_{REF}$ serves as the reference voltage for the operational amplifier 6. The pn junction of the photodiode 5 is negatively biased by this reference voltage. Any further details of the detection unit 1 which are familiar to a person skilled in the art are not specifically described here.

The connection 2 has a defined resistor $R_{VI}$, which serves as voltage-current converter and via which the output of the detection unit 1 is connected to an input IN of the evaluation unit 3. The voltage at the input IN is regulated to the value of the reference voltage $V_{REF}$ by means of an operational amplifier 7, whose non-inverting input is connected to the reference voltage $V_{REF}$ and whose inverting input is connected to the input IN and whose output controls a transistor 8. The transistor 8 is depicted as an MOS transistor in this case; however, it is perfectly possible to use other components, for example a bipolar transistor, as well in this case. A feedback circuit for obtaining a small input resistance can also expediently be used in this case. The current flowing through the transistor 8, namely the input current $I_{IN}$, is proportional to the photocurrent $I_{PH}$ generated by the photodiode 5; the proportionality factor is in this case given by the resistance ratio $R_{PH}/R_{VI}$. The input current $I_{IN}$ is amplified by the factor k by means of a current amplifier 9, whose gain factor is variable. Consequently, an amplified current $k*I_{IN}$ is available for evaluation by the evaluation unit 3.

The input dynamic range of conventional evaluation units 3 is limited by the trend towards falling supply voltages. The reference voltage and thus also the supply voltage of the detection unit 1 are, on the other hand, held at higher values, since, with the ever higher playback speeds desired for optical recording media, the requirements made of the bandwidth of the detector unit 1 are also high. To that end, the parasitic capacitance of the photodiode 5 must be kept low. This is ensured by a correspondingly high reference voltage $V_{REF}$, which is 2.5 volts in the exemplary embodiment. Customary detection units 1 have voltage outputs, with the result that the output level in detected signals varies in the range of a few hundreds of millivolts above the reference voltage. The evaluation unit 3 is usually part of an integrated circuit. In large-scale integrated circuits, the proportion of the digital circuit is predominant, which is why it is expedient, for cost reasons too, to use CMOS technology in this case. The trend in this case is towards low supply voltages, for example towards 3.3 volts, 2.5 volts or even lower, since a not inconsiderable saving of energy can be attained in this way. This is at odds with the customary output levels of the detection unit 1. This conflict is eliminated by the measures according to the invention.

The present invention makes it possible to evaluate the output signals of a conventional detection unit 1, operated with 5 volts, with no loss of dynamic range or bandwidth, by means of an evaluation unit 3 having a lower supply voltage. This is achieved according to the invention by virtue of the fact that the evaluation unit 3 has a current input, that is to say evaluates the input current $I_{IN}$. This has the advantage, moreover, that this solution is more flexible with regard to gain matching in the evaluation unit 3. This gain can, on the one hand, be preset by varying the resistor $R_{VI}$ provided for voltage-current conversion. Unlike the case for voltage inputs, the input dynamic range in this case does not limit the possible gain range. A further advantage of the solution according to the invention is that it is more flexible with regard to values of the reference voltage $V_{REF}$ which have different magnitudes and are used for different types of detection units 1. A further advantage of the solution according to the invention is that a large gain range is achieved by virtue of the external resistor $R_{VI}$, which can be chosen freely within limits and, under certain circumstances, is even of variable design.

According to the invention, the input IN of the evaluation unit 3 is regulated to the reference voltage $V_{REF}$ by means of the control loop comprising operational amplifier 7 and transistor 8. The voltage output of the detection unit 1 is converted to the current input of the evaluation unit 3 by means of the external resistor $R_{VI}$. In general, the value of this resistor $R_{VI}$ is much greater than that of the output resistance of the detection unit 1 and that of the input resistance of the evaluation unit 3, with the result that the resistor $R_{VI}$ does not influence the bandwidth performance. The resistor $R_{VI}$ is varied within given limits, with the result that the entire gain can be matched. The voltage at the current input IN is fixed at the reference voltage $V_{REF}$ by the control loop without this having an influence on the dynamic range of the transmitted signal. In addition to the simple input circuit described in FIG. 1, a differential input circuit is also advantageously used, as described with respect to FIG. 3. Feedback circuits serving to reduce the input resistance can also expediently be used in this case. A small input resistance is desirable since the pole frequency which it forms together with the parasitic input capacitance is increased. This enables higher bandwidths.

Figure 2:
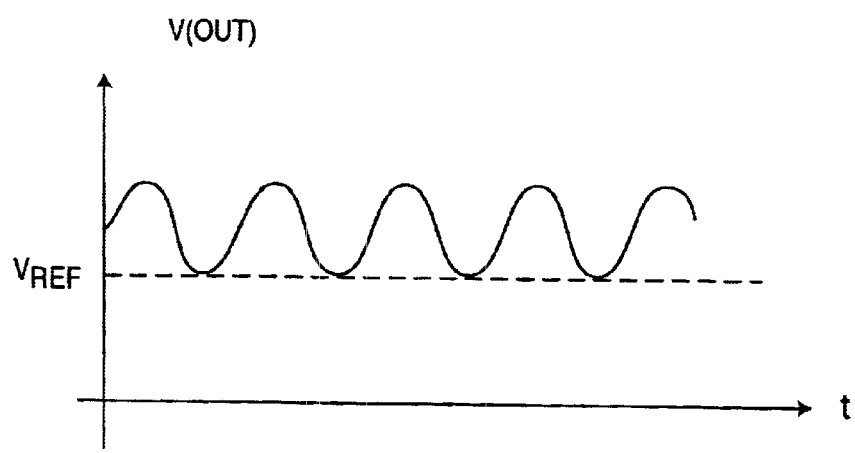
FIG. 2 shows a schematic illustration of the output voltage of the detector unit.

FIG. 2 shows, for illustration purposes, the output voltage $V_{OUT}$ against time. It can be seen that the output voltage $V_{OUT}(t)$ in the example varies approximately sinusoidally but always above the reference voltage $V_{REF}$.

Figure 3:
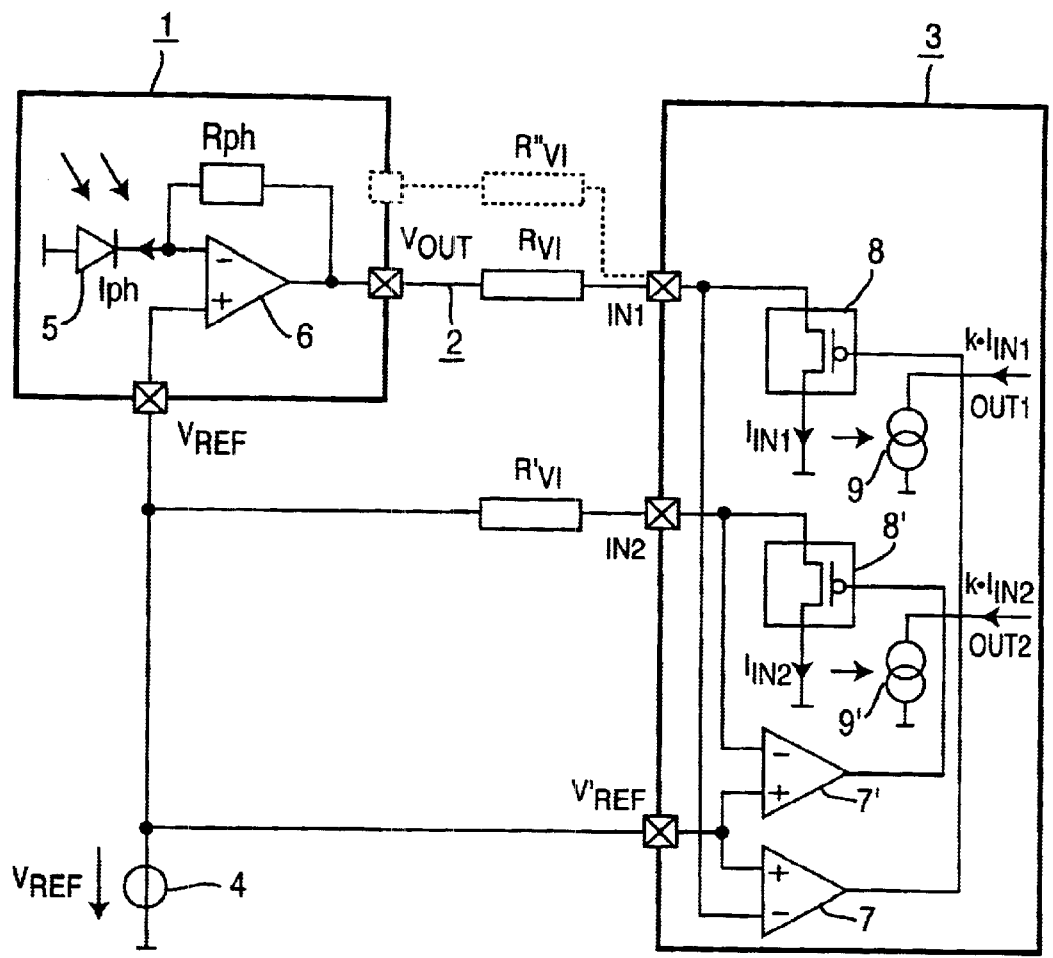
FIG. 3 shows a schematic illustration of a second embodiment in accordance with FIG. 1.

FIG. 3 shows an exemplary embodiment of the invention with a differential input circuit. The detection unit 1 is unchanged by comparison with FIG. 1 and is not, therefore, described in any more detail here. Identical reference symbols to those of FIG. 1 designate identical or functionally identical elements. In addition to the operational amplifier 7, the transistor 8 and the current amplifier 9, which are connected to the input IN1 and output the amplified current $k*I_{IN1}$, the detection unit 3 is provided with a further operational amplifier 7', a further transistor 8' and a further current amplifier 9'. The operational amplifier 7' is coupled to the reference voltage $V_{REF}$ by its non-inverting input, while its inverting input is connected to an input IN2 of the evaluation unit 3. The latter is connected to the reference voltage $V_{REF}$ via a further resistor $R'_{VI}$, whose value corresponds to that of the resistor $R_{VI}$. The reference voltage $V_{REF}$ is subjected to voltage-current conversion by means of the control loop formed by operational amplifier 7' and transistor 8'. The corresponding current $I_{IN2}$ is amplified by means of the current amplifier 9' and made available for further processing as amplified current $k*I_{IN2}$. The amplified currents $k*I_{IN1}$ and $k*I_{IN2}$ are compared in order to evaluate the detected photocurrent $I_{PH}$; their difference is formed in the simplest case. In this case, too, the transistor 8' is illustrated as a CMOS component, but a bipolar transistor can also be used in this case.

The input current $I_{IN}$ of FIG. 1 and the input current $I_{IN1}$ of FIG. 3 are related to the photocurrent $I_{PH}$ as follows:

$I_{IN}=I_{PH}*(R_{PH}/R_{VI})$. The resistors $R_{VI}$ and $R'VI$ of FIG. 3 are chosen to have as far as possible identical values, in order to ensure a high accuracy. A deviation of 1% or better is envisaged in this case. One advantage of the present invention is that it ensures increased flexibility. Thus, by way of example, advanced CMOS technology can be used for the evaluation unit 3, without any limitations on supply voltage, input dynamic range, bandwidth and gain adjustment, in which case different photodetector units with different reference and supply voltages and gain factors can nevertheless be employed.

The use of a further connection between a further output of the detection unit 1 and the input IN 1 of the evaluation unit 3, the said connection being provided with a defined resistor $R''_{VI}$, is indicated by broken lines in the upper part of FIG. 3. More than two connections of this type leading to the same input IN1 are also possible in this case. One advantage of this variant is that, by this means, addition of the various output signals of the detection unit is performed in a simple manner. By way of example, these output signals are the signals of the E and F detectors in the event of the known three-beam tracking method being used, or other photodetector signals to be summed. Consequently, an addition circuit in the evaluation unit is not necessary, and the number of required inputs of the evaluation unit is thus also reduced. Addition that can be realised in such a simple manner is not possible if the evaluation unit has voltage inputs, since voltages cannot be added so easily.

Figure 4:
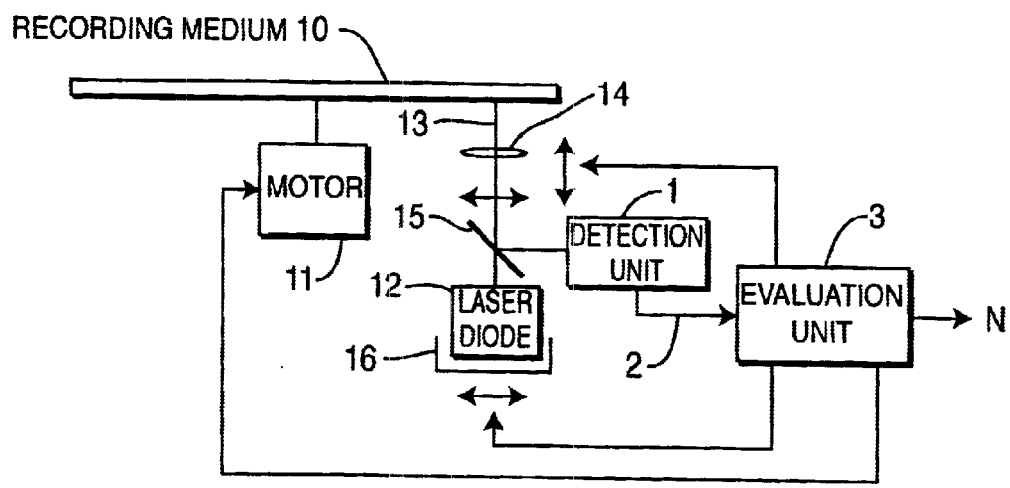
FIG. 4 shows the schematic structure of an apparatus according to the invention.

FIG. 4 shows the schematic structure of an apparatus according to the invention for scanning optical recording media 10. The optical recording medium 10 is designed as a circular disk, for example as a CD or DVD, which is made to rotate by a motor 11. A laser diode 12 generates a scanning beam 13, which is focused onto the recording medium 10 by means of an objective lens 14. The said beam is reflected from the recording medium and directed onto the detection unit 1 by means of a semitransparent mirror 15. The said detection unit is connected to the evaluation unit 3 by means of the connection 2. The evaluation unit 3 converts the signal or signals received from the detection unit 1 on the one hand into control signals for the motor 11, the lens 14 and a scanner 16. On the other hand, it outputs a useful signal N generated from its input signals. In this case, the objective lens 14 can be moved both in the direction of the scanning beam 13 and perpendicularly thereto, in order to enable, on the one hand, exact focusing and, on the other hand, correct following of tracks situated on the recording medium 10. The scanner 16, to which the laser diode 12, the objective lens 14, the semitransparent mirror 15 and the detection unit 1 are connected, can be moved, in order to follow the tracks situated on the recording medium 10, in a larger range in the radial direction with regard to the recording medium 10. Further details concerning the function and the structure are known to the person skilled in the art and are not, therefore, specifically described here.

Figure 5:
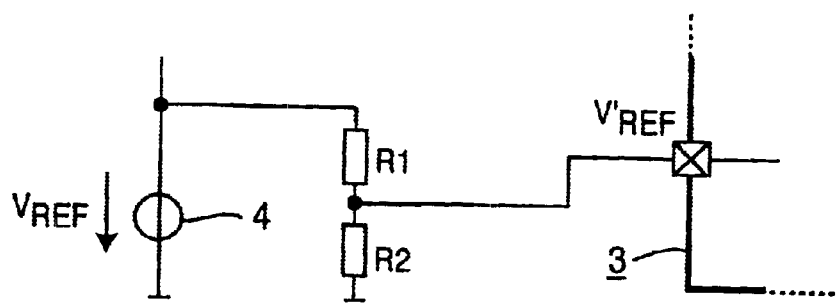
FIG. 5 shows a modification of part of FIG. 3.

FIG. 5 shows a modification of the connection from the reference voltage source 4 to the reference voltage input of the evaluation unit 3 in a detail of the lower part of FIG. 3. A voltage divider is realised by means of two resistors $R_1$ and $R_2$, which voltage divider decreases the reference voltage $V'_{REF}$ present at the evaluation unit 3 to a fraction of $V_{REF}$, to $V'_{REF}=R_2/(R_1+R_2)*V_{REF}$. The inputs IN1 and IN2 are correspondingly regulated to the lower voltage $V'_{REF}$. They are then at a fraction of the voltage required for the detection unit 1. By virtue of the differential structure of the circuit of the evaluation unit 3, the DC components generated by the resistors $R_{VI}$ and $R'_{VI}$ on account of the changed reference voltage in comparison with FIG. 3 are eliminated, since the currents $k*I_{IN1}$ and $k*I_{IN2}$ are subtracted from one another for the purpose of further evaluation.

Figure 6:
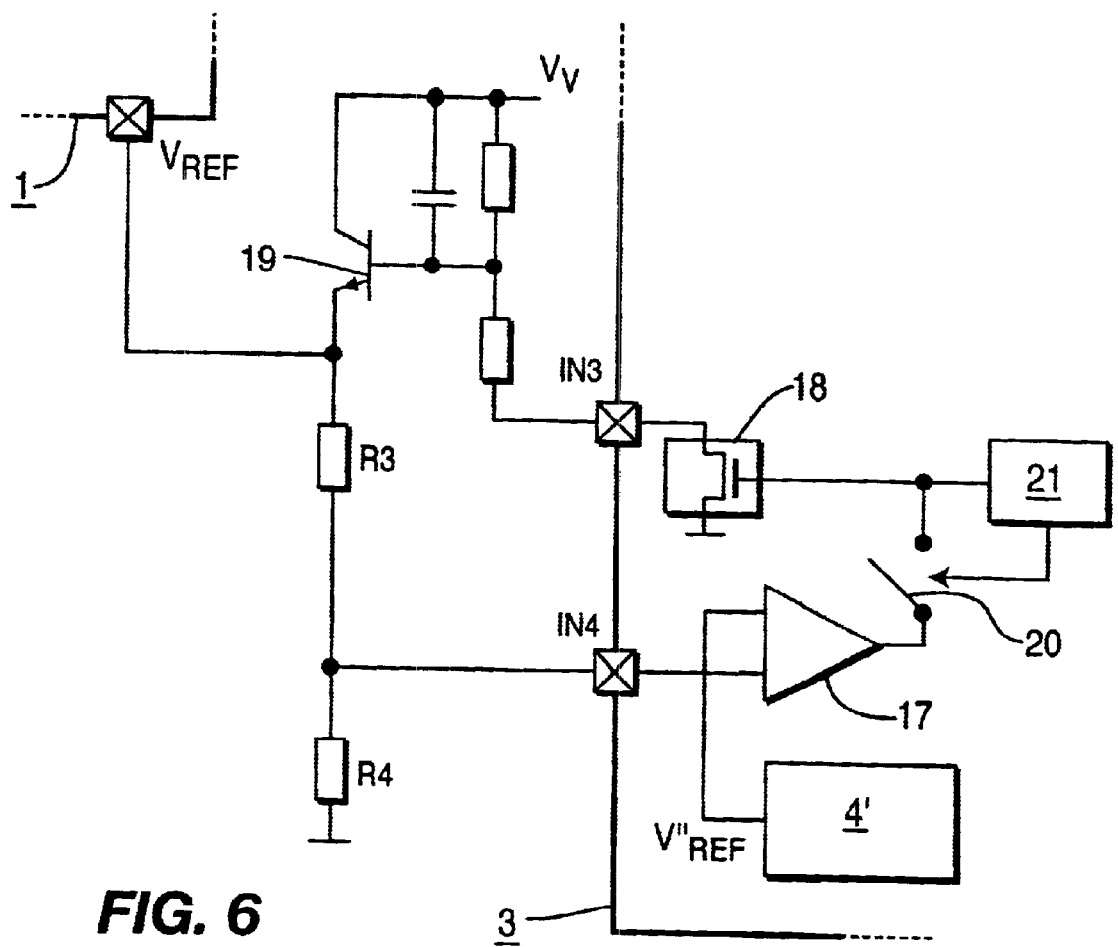
FIG. 6 shows a reference voltage source integrated in the evaluation unit.

FIG. 6 shows a reference voltage source 4' integrated in the evaluation unit 3, and also the lower part of the exemplary embodiment with respect to FIG. 3. The internal reference voltage $V''_{REF}$ generated by the reference voltage source 4' is utilised in accordance with the reference voltage $V_{REF}$ of FIG. 3; the corresponding circuit is not shown here as well, for the sake of simplicity.

On account of the lower supply voltage of the evaluation unit 3 in comparison with the detection unit 1, the reference voltage $V''_{REF}$ is lower than is required for the reference voltage $V_{REF}$ Of the detection unit 1. Therefore, voltage boosting is achieved by means of cost-effective components arranged externally. In the exemplary embodiment, the said components are two resistors $R_3$, $R_4$ and also a circuit comprising transistor 19, resistors and capacitor. This circuit is supplied with a boosted supply voltage VV and causes a reference voltage $V_{REF}$ that is suitable for the detection unit 1 to be generated between transistor 19 and resistor $R_3$. A control loop comprising operational amplifier 17 and transistor 18 ensures that the input IN4 of the detection unit 3 is always held at the voltage $V''_{REF}$. The input IN4 is connected to the connection between the resistors R3 and R4, with the result that the following holds true for the value of the supply voltage, $V_{REF}=(R_3+R_4)/R_4*V''_{REF}$. A safety circuit 21, which is not illustrated in any detail here, holds a switch 20 open during the run-up of the supply voltages, in order to prevent impermissibly high voltages occurring across the transistor 18 designed as an MOS component. This is done for example by the MOS transistor 18 being driven by the safety circuit 21 during the run-up of the supply voltage. After the run-up, the switch 20 is closed and the control loop with the operational amplifier 17 is in operation. The components which are situated between the base and the collector of the external transistor 19, namely the resistor and the capacitor, determine the stability of the control loop serving for boosting the voltage. The resistor situated between the base of the external transistor 19 and the MOS transistor 18 situated in the evaluation unit 3 causes impermissibly high voltages to occur across the latter transistor. Therefore, these external components have chosen dimensions matched to the component properties and the voltage values to be used. However, the safeguarding function can also be achieved by other measures familiar to a person skilled in the art.

What is claimed is:

1. Apparatus for scanning optical recording media, comprising:
    a detection unit with a photodetector and a reference voltage associated therewith;
    an evaluation unit having an input; and
    a connection for connecting the detection unit and the input of the evaluation unit, the evaluation unit having a controller that holds the input at a value of the reference voltage associated with the detection unit.

2. Apparatus according to claim 1, wherein the evaluation unit has a differential input.

3. Apparatus according to claim 1, wherein the evaluation unit has a further control loop, whose desired value corresponds to the reference voltage and whose actual value is connected to the reference voltage via a defined resistor corresponding to that of the connection.

4. Apparatus according to claim 1, wherein the evaluation unit has a current amplifier.

5. Apparatus according to claim 4, wherein the gain factor of the current amplifier is variable.

6. Apparatus according to claim 1, wherein the evaluation unit is connected to a reference voltage source via a voltage divider.

7. Apparatus according to claim 1, wherein the evaluation unit has a reference voltage source.

8. Apparatus according to claim 1, wherein the connection has a defined resistor and the evaluation unit has a control loop whose desired value corresponds to the reference voltage associated with the detection unit and whose actual value is a signal present on the connection.

9. Apparatus according to claim 8, wherein the evaluation unit has a differential input.

10. Apparatus according to claim 8, wherein the evaluation unit has a further control loop, whose desired value corresponds to the reference voltage and whose actual value is connected to the reference voltage via a defined resistor corresponding to that of the connection.

11. Apparatus according to claim 8, wherein the evaluation unit has a current amplifier.

12. Apparatus according to claim 11, wherein the gain factor of the current amplifier is variable.

13. Apparatus according to claim 8, wherein the defined resistor is a variable resistor.

14. Apparatus according to claim 8, wherein the evaluation unit is connected to a reference voltage source via a voltage divider.

15. Apparatus according to claim 8, wherein the evaluation unit has a reference voltage source.

* * * * *